United States Patent

Sakai et al.

[11] Patent Number: 5,912,905
[45] Date of Patent: Jun. 15, 1999

[54] ERROR-CORRECTING ENCODER, ERROR-CORRECTING DECODER AND DATA TRANSMITTING SYSTEM WITH ERROR-CORRECTING CODES

[75] Inventors: Yasuyuki Sakai; Hideo Yoshida; Toshio Tokita, all of Tokyo, Japan

[73] Assignee: Mitsubishi Denki Kabushiki Kaisha, Tokyo, Japan

[21] Appl. No.: 08/803,236

[22] Filed: Feb. 20, 1997

Related U.S. Application Data

[63] Continuation of application No. 08/384,950, Feb. 7, 1995, Pat. No. 5,699,368.

[30] Foreign Application Priority Data

Mar. 25, 1994 [JP] Japan ..................... 6-55941

[51] Int. Cl.$^6$ .................................................. H03M 13/00
[52] U.S. Cl. .................. 371/37.11; 371/37.6; 371/37.12
[58] Field of Search ............................. 371/37.11, 37.06, 371/37.12

[56] References Cited

U.S. PATENT DOCUMENTS

| | | | |
|---|---|---|---|
| 3,452,328 | 6/1969 | Hsiao et al. | 371/37.6 |
| 4,782,490 | 11/1988 | Tenengolts | 371/37.5 |
| 4,899,341 | 2/1990 | Tomimitsu | 371/37.6 |
| 4,979,173 | 12/1990 | Geldman et al. | 371/39.1 |
| 5,107,503 | 4/1992 | Riggle et al. | 371/37.11 |
| 5,107,506 | 4/1992 | Weng et al. | 371/39.1 |
| 5,140,596 | 8/1992 | Weldon, Jr. | 371/39.1 |
| 5,365,529 | 11/1994 | Mester | 371/37.11 |
| 5,375,127 | 12/1994 | Leak et al. | 371/40.1 |
| 5,699,368 | 12/1997 | Sakai et al. | 371/37.1 |

FOREIGN PATENT DOCUMENTS

| | | |
|---|---|---|
| 0147041 | 7/1985 | European Pat. Off. . |
| 0367268 | 5/1990 | European Pat. Off. . |
| 2673341 | 8/1992 | France . |
| 62-123231 | 5/1988 | Japan .................................. 371/37.1 |
| 1007816 | 1/1989 | Japan . |

OTHER PUBLICATIONS

Whiting, D., "Bit–Serial Reed–Solomon Decoders in VLSI", 1985, Ph.D. Thesis 8501350, California Inst. of Technology, pp. 88–99, Dec. 1985.

Tomoko Matsushima "A Design of a High–Speed Reed–Solomon Codec LSI" pp. 103–106.

N. Glover, et al, "Practical Error Correction Design for Engineers", 2nd, ed., Data Systems Technology Corp., pp. 49, 50, 243–249.

*Primary Examiner*—Stephen M. Baker

[57] ABSTRACT

The present invention provides an error-correcting encoder and an error-correcting decoder which encode/decode a plurality of information symbols in parallel with a reduced number of shifts, which enables a reduction in the processing time. The error-correcting encoder of the invention includes a shift register including stages equal to a predetermined number of check symbols for inputting different information symbols in parallel from a plurality of input terminals. The encoder also includes a Galois field multiplier for multiplying each coefficient and a Galois field adder to obtain the predetermined number of check symbols from the information symbols. The encoder can generate the predetermined number of check symbols with shifts, the number of which is reduced according to the number of parallel inputs. The syndrome generator of the error-correcting decoder of the invention includes a plurality of Galois field multipliers which multiply the coefficients for calculating syndromes for inputting different code symbols in parallel from a plurality of input terminals. The syndrome generator also includes a Galois field adder and a shift register to obtain the predetermined syndrome generating polynomial. The syndrome generator can obtain the desired syndromes with shifts, the number of which is reduced according to the number of parallel inputs.

16 Claims, 13 Drawing Sheets

FIG. 8
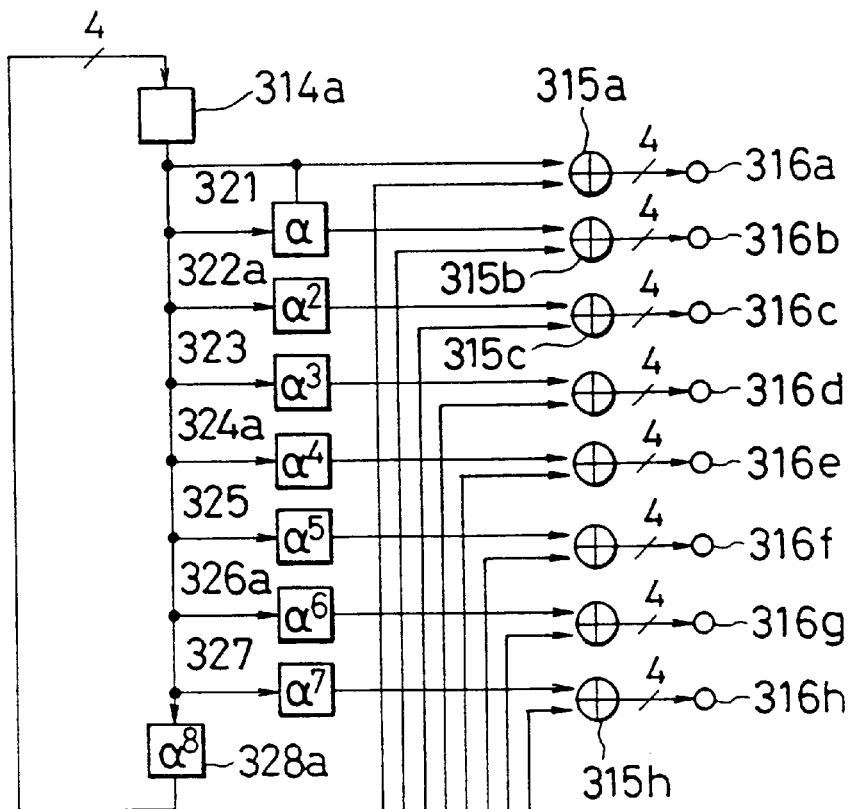
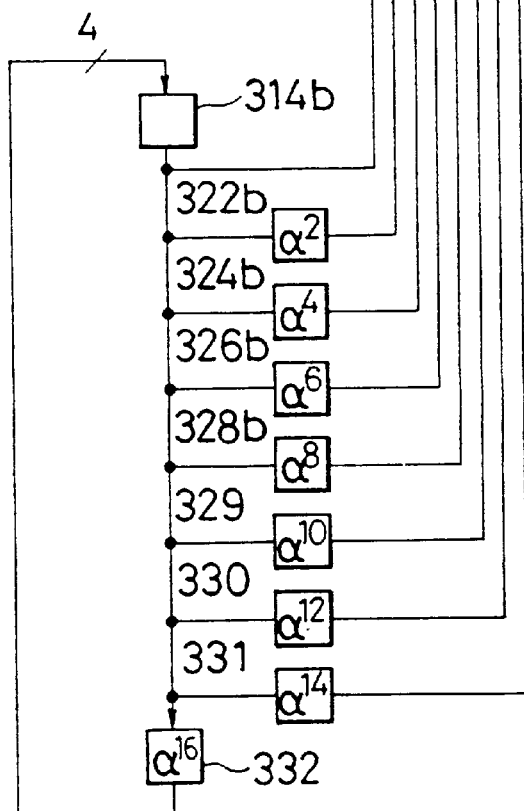

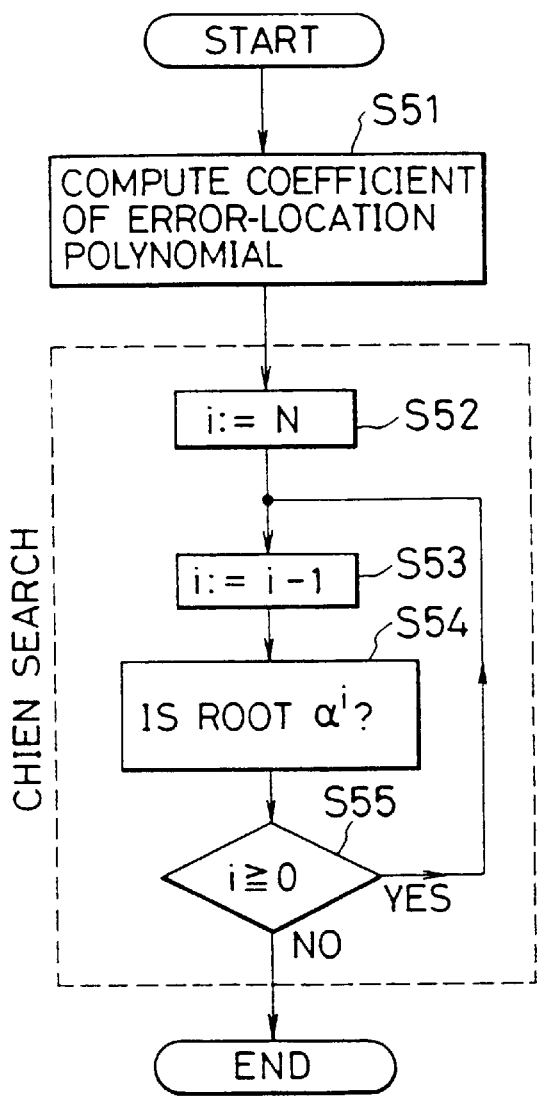
FIG. 10(a) [PRIOR ART]
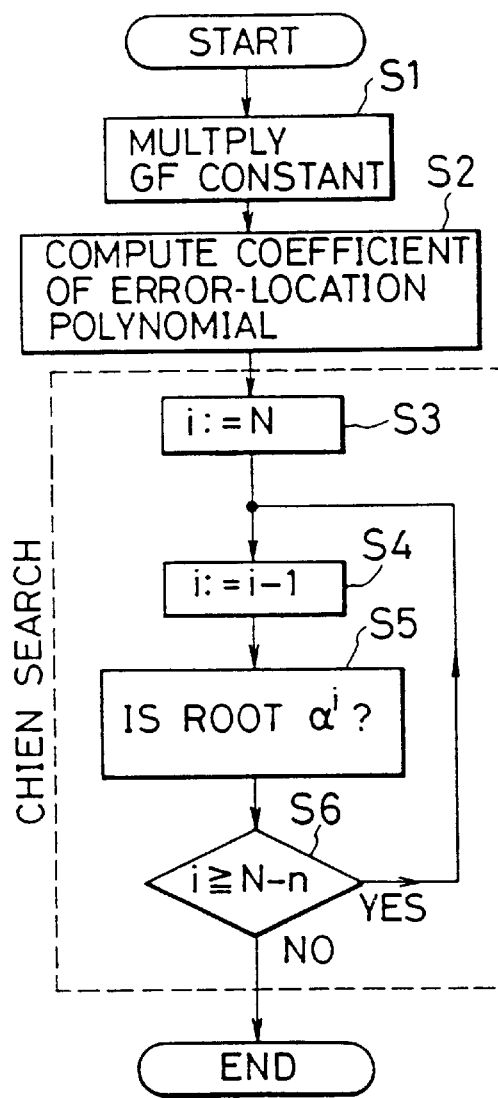
FIG. 10(b)

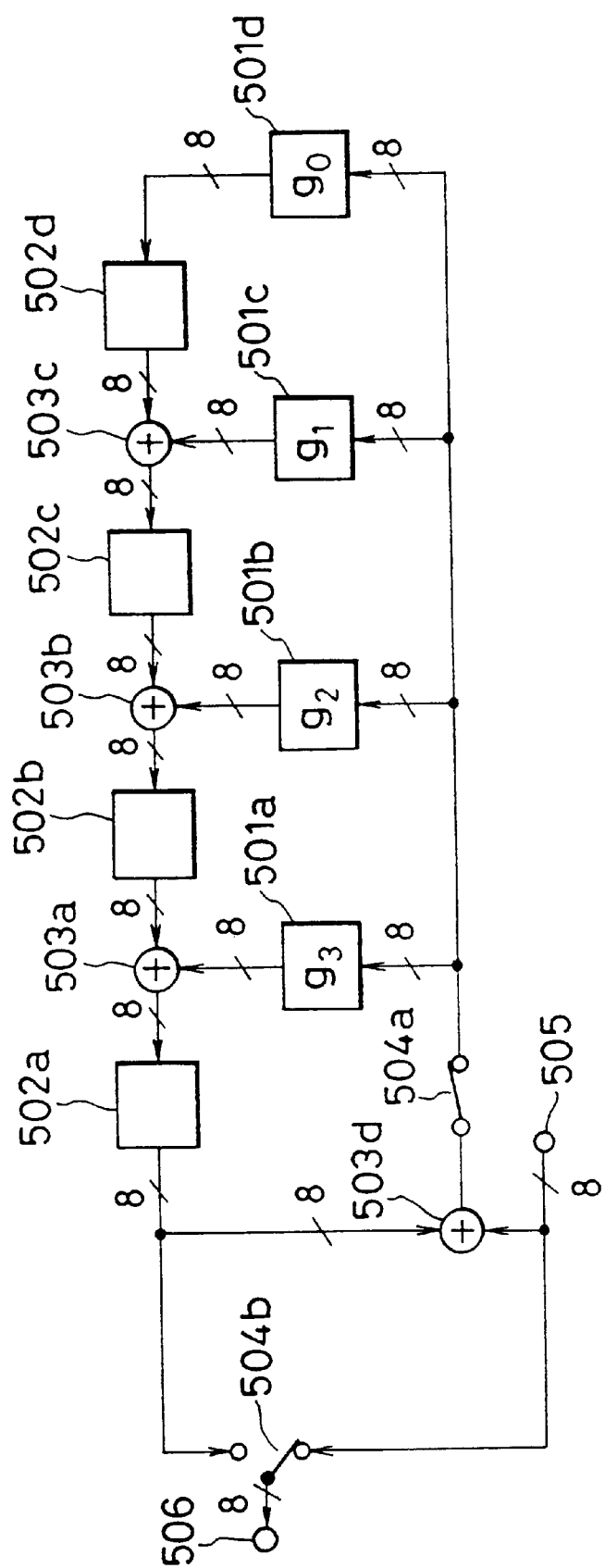
FIG. 11 [PRIOR ART]

ERROR-CORRECTING ENCODER, ERROR-CORRECTING DECODER AND DATA TRANSMITTING SYSTEM WITH ERROR-CORRECTING CODES

This is a continuation of application Ser. No. 08/384,950, filed Feb. 7, 1995, now U.S. Pat. No. 5,699,368.

BACKGROUND OF THE INVENTION

1. Field of the Invention

The present invention relates to an error-correcting encoder, an error-correcting decoder and a data transmitting system with error-correcting codes.

2. Description of the Prior Art

Upon transmitting digital information, an error-correcting code is often used; one of the typical error-correcting codes is Reed-Solomon (RS) code. For further reference, the coding theory and RS code is disclosed in "Coding Theory", Hideki Imai, Electronic Information and Communication Meeting, 4th edition, Jun. 1, 1992.

The principle of the coding theory will be briefly explained below. To encode q-element RS code having a code length n and k information symbols, a polynomial having k information symbols, $m_{k-1}, \ldots, m_1, m_0$ as its coefficients:

$$M(x) = m_{k-1} x^{k-1} + \ldots + m_1 x + m_0$$

is multiplied by $x^{n-k}$, and the result of that is divided by a generating polynomial G (x) and the remainder is obtained. Namely, $$R(x) = r_{n-k-1} x^{n-k-1} + \ldots + r_1 x + r_0$$

that satisfies $$M(x) x^{n-k} = Q(x) G(x) + R(x)$$

is obtained. R (x) is called the remainder polynomial. And code polynomial W (x) is obtained by:

$$W(x) = M(x) x^{n-k} - R(x)$$

The coefficients of W (x) are lined up from the term of the higher degree as follows:

$$(m_{k-1}, \ldots, m_1, m_0, -r_{n-k-1}, -r_1, -r_0)$$

There appear k information symbols in the left-hand side of the above line and (n-k) check symbols appear in the right-hand side, which are obtained by multiplying coefficients of the remainder polynomial by (−1).

A conventional error-correcting encoder is now described referring to FIG. 11. In this case, a double-error-correcting RS code on the GF (Galois field) ($2^8$), having code length n=255, number of information symbols k=251 and the minimum distance d=5, is used as the error-correcting code.

FIG. 11 is a block diagram showing the conventional error-correcting encoder. In FIG. 11, $501_a$–$501_d$ are Galois field multipliers which multiply each of the coefficients of the generating polynomial:

$$G(x) = x^4 + g_3 x^3 + g_2 x^2 + g_1 x + g_0$$

The four Galois field multipliers perform the following multiplications respectively:

$501_a \ldots \times g_3$
$501_b \ldots \times g_2$
$501_c \ldots \times g_1$
$501_d \ldots \times g_0$ $502_a$–$502_d$ denote 8-bit shift registers. $E_X$OR gates $503_a$–$503_d$ perform $E_X$OR operations bit by bit. $504_a$, $504_b$ denote switches, $505$ denotes an input terminal, and $506$ denotes an output terminal.

The following describes the operation of the error-correcting encoder. The switch $504_a$ is connected and the switch $504_b$ is turned to the lower side of the circuit as shown in the FIG. 11. 251 information symbols, $m_{250}$–$m_0$, are input with shifting one by one at the input terminal $505$ sequentially. After all the information symbols are input, the switch $504_a$ is disconnected, the switch $504_b$ is turned to the opposite side of the circuit (the upper side of the circuit in FIG. 11) and the contents of the registers $502_a$–$502_d$ are output. In this way, the output terminal $506$ transmits the coefficients of the code polynomial W (x) sequentially from the term of the higher degree.

A syndrome generator of a conventional error-correcting decoder is now described referring to FIG. 12. In this case, the syndrome generator receives the RS codes transmitted by the above-mentioned conventional error-correcting encoder.

Substituting root $\alpha^i$ (i=0, 1, 2, 3) ($\alpha$ is a root of a primitive polynomial) of generating polynomial G (x) to received polynomial $$y(x) = y_{254} x^{254} + \ldots + y_1 x + y_0$$

and syndrome $S_i = y(\alpha^i)$ is obtained.

FIG. 12 is a block diagram showing the conventional syndrome generator. $601$ denotes an 8-bit shift register. A Galois field multiplier $602$ multiplies $\alpha_i$. An $E_X$OR gate $603$ performs an $E_X$OR operation bit by bit. $604$ denotes an input terminal and $605$ denotes an output terminal.

The operation of the syndrome generator will be explained below. The syndrome $S_i$ is calculated by inputting the coefficients of the received polynomials from $y_{254}$ to $y_0$, from higher to lower degree, sequentially at the input terminal $604$, with shifting word by word. After all the received words are input, the syndrome $S_i$ is output from the output terminal $605$.

A conventional Chien-Search circuit of the error-correcting decoder is now described referring to FIG. 13. Chien-Search is a method for analyzing an error location by checking whether $\delta(\alpha^i)$ is 0 or not with substituting $\alpha^i$ (i=0, 1, . . . , n−1), which shows the power of $\alpha$, to error location polynomial of t times error-correcting code:

$$\delta(z) = z^t + \delta_{t-1} z^{t-1} + \ldots + \delta_1 z + \delta_0$$

When $\delta(\alpha^i) = 0$, an error occurs at the received word $y_i$ of the received polynomial:

$$y(x) = y_{254} x^{254} + \ldots + y_1 x + y_0$$

In this case, the codes transmitted by the above conventional encoder are received. The check symbol is double-error-correcting code and the error location polynomial $\delta(z)$ becomes:

$$\delta(z) = z^2 + \delta_1 z + \delta_0.$$

Coefficients $\delta_1$, $\delta_0$ of $\delta(z)$ are calculated previously from the syndrome. Detailed calculation of $\delta_1$, $\delta_0$ is described in the above-mentioned "Coding Theory", Hideki Imai, Electronic Information and communication meeting.

FIG. 13 is a block diagram showing the conventional Chien-Search circuit. In the figure, Galois field multipliers 701 and 702 perform the following multiplications respectively:

701 ... ×$\alpha$

702 ... ×$\alpha^2$ $703_a$ and $703_b$ denote 8-bit shift registers. An $E_X$OR gate 704 performs an $E_X$OR operation bit by bit. 705 denotes an output terminal.

The following describes the operation of the Chien-Search circuit. Initial values $\delta_1$ and "1" are set in the registers $703_a$ and $703_b$, respectively. With shifting the received words, it is checked whether the sum of the outputs of the registers, that is, the output from the output terminal 705, becomes $\delta_0$ or not. When the output becomes $\delta_0$ at the initial status, $\alpha^0$ is the root of $\delta(z)$, which means an error occurs in the received word $y_0$. In the same way, when the output becomes $\delta_0$ after i shifts, $\alpha^i$ is the root of $\delta(z)$, which means an error occurs in the received word $y_i$.

Another conventional error-correcting decoder is explained below referring to FIG. 14. In this case, the decoder receives shortened code on the GF ($2^8$), in which the code length n is less than 255; for example, double-error-correcting RS code having the code length n=36, the number of information symbols k=32, and the minimum distance d=5. The error-correcting decoder generates a syndrome and detects the roots of the error location polynomial $\delta(z)$ by checking the terms from the highest degree by a Chien-Search.

In FIG. 14, a syndrome generating circuit 801 includes 4 syndrome generators, each of which was described above and shown in FIG. 12. Syndrome generator 804 generates syndrome $S_0$, syndrome generator 805 generates syndrome $S_1$, syndrome generator 806 generates syndrome $S_2$, and syndrome generator 807 generates syndrome $S_3$.

An error-location polynomial generator 802 calculates coefficients $\delta_0$, $\delta_1$ of the above error-location polynomial using the syndromes $S_0$–$S_3$. A Chien-Search circuit 803, which is configured as shown in FIG. 13, sets the registers to the above values $\delta_0$, $\delta_1$ and analyzes the error-location. 812 denotes input terminals. 813 denotes an output terminal.

The operation of the decoder is explained below. The syndrome generating circuit 801 generates 4 syndromes $S_0$, $S_1$, $S_2$, $S_3$.

Using these syndromes, the error-location polynomial generator 802 calculates the coefficients $\delta_1$, $\delta_0$ of the error-location polynomial:

$$\delta(z) = z^2 + \delta_1 z + \delta_0$$

Then, Chien-Search circuit 803 performs a Chien-Search. Galois Field multipliers 809, 810 perform the following multiplications respectively:

809 ... ×$\alpha^{-1}$

810 ... ×$\alpha^{-2}$ $\delta_1$ is set as an initial value in a register $808_a$ and "1" is set in a register $808_b$. It is checked whether the sum of the outputs of the two registers, that is, the output from the output terminal 813, becomes $\delta_0$ or not. Generally, a Chien-Search should be performed from the term of the highest degree in the received polynomial. In this example, the shortened code is received, in which the code length n=36, and the received polynomial becomes:

$$y(x) = y_{35} x^{35} + \ldots + y_1 x + y_0$$

Thus, all the coefficients of the terms from 254 degrees to 36 degrees in the received polynomial become "0". Accordingly, it is required to shift the received word previously 255−36=219 times for searching an error-location from the term of 35 degrees, the highest degree in this case. After the 220th shifting, if the output from the output terminal 813 becomes $\delta_0$, $\alpha^{35}$ is the root of the error-location polynomial $\delta(z)$, which means an error occurs in the received word $y_{35}$. In the same way, if the output from the output terminal 813 becomes $\delta_0$ after the (220+i)th shifting, $\alpha^{35-i}$ is the root of the error-location polynomial $\delta(z)$, which means an error occurs in the received word $y_{35-i}$.

As has been described, the conventional error-correcting encoder has to execute the encoding process symbol by symbol and a high-speed operation cannot be done.

The syndrome generating circuit of the conventional error-correcting decoder has to execute the syndrome generating process symbol by symbol and a high-speed operation cannot be done.

The Chien-Search circuit of the conventional error-correcting decoder has to execute the searching process symbol by symbol and a high-speed operation cannot be done.

Another conventional error-correcting decoder needs prior shifting according to the shortened length of the code in order to obtain the root of the error-location polynomial $\delta(z)$ of the shortened cyclic code on the GF, having code length n, by searching from the term of the highest degree by a Chien-Search. And the prior shifting takes a long time.

SUMMARY OF THE INVENTION

The present invention is provided to solve the above-mentioned problems. It is the main object of the invention to provide a high-speed error-correcting encoder which encodes a plurality of the information symbols simultaneously and in parallel.

Another object of the invention is to provide an error-correcting decoder including a high-speed syndrome generating circuit which generates a plurality of syndromes from a plurality of received symbols simultaneously and in parallel.

Yet another object of the invention is to provide an error-correcting decoder including a high-speed Chien-Search circuit which checks a plurality of locations in a received word simultaneously and in parallel by a Chien-Search.

Still another object of the invention is to provide an error-correcting decoder which can perform a Chien-Search at a high speed. It does so by searching the root of the error-location polynomial $\delta(z)$ of the shortened cyclic code on the GF, which has code length n, from the term of the highest degree by a Chien-Search.

According to one embodiment of the invention, an error-correcting encoder for encoding information symbols includes:

(A) shift registers having a plurality of stages equal to the number of check symbols, for generating check symbols by a reduced number of shifts; and (B) a plurality of Galois field adders and Galois field multipliers for forming check-symbols-generating-logic so that said check symbols are produced by the reduced number of shifts using plural inputs of the information symbols at the same time and outputs of the shift register stages and for feeding outputs of the check symbols generating logic to the shift register stages.

According to another embodiment of the invention, an error-correcting decoder for decoding code symbols includes:

a plurality of syndrome generators composed of plural Galois field multipliers, and composed of plural Galois field adders, for generating syndromes of a received word with a reduced number of shifts by using plural received symbols at a time;

an error-location polynomial generator for computing coefficients of an error-location polynomial using the syndromes; and a Chien-Search circuit for analyzing error locations using the syndromes.

An error-correcting decoder for decoding code symbols according to another embodiment of the invention includes:

a syndrome generator for generating syndromes of received words;

an error-location polynomial generator for computing coefficients of an error-location polynomial using the syndromes; and a Chien-Search circuit composed of plural Galois field multipliers, and composed of plural Galois field adders, for analyzing a plurality of error locations at a time in a reduced number of shifts using the coefficients of the error-location polynomial.

An error-correcting decoder for decoding code symbols according to another embodiment of the invention includes:

(A) a plurality of syndrome generators for generating syndromes of a received word;

(B) a plurality of Galois field multipliers for multiplying syndromes of the received word by shift required coefficients of a Galois field to form shifted syndromes corresponding to a code polynomial having coefficients of all zeros in lower degrees;

(C) an error-location polynomial generator for computing coefficients of the error-location polynomial using the shifted-syndromes; and (D) a Chien-Search circuit for analyzing error locations using the coefficients of the error-location polynomial.

Other objects features, and advantages of the invention will be apparent from the following description when taken in conjunction with the accompanying drawings.

BRIEF DESCRIPTION OF THE DRAWINGS

In the drawings

FIG. 8 is a block diagram showing the configuration of a Chien-Searcb circuit of an error-correcting decoder according to a sixth embodiment of the invention;

FIG. 10($a$) is a flow chart showing a conventional error-correcting decoding system;

FIG. 10($b$) is a flow chart showing an error-correcting decoding system according to a tenth embodiment of the invention;

FIG. 11 is a block diagram showing the configuration of a conventional error-correcting encoder;

DETAILED DESCRIPTION OF THE PREFERRED EMBODIMENT

Embodiment 1

Figure 1:
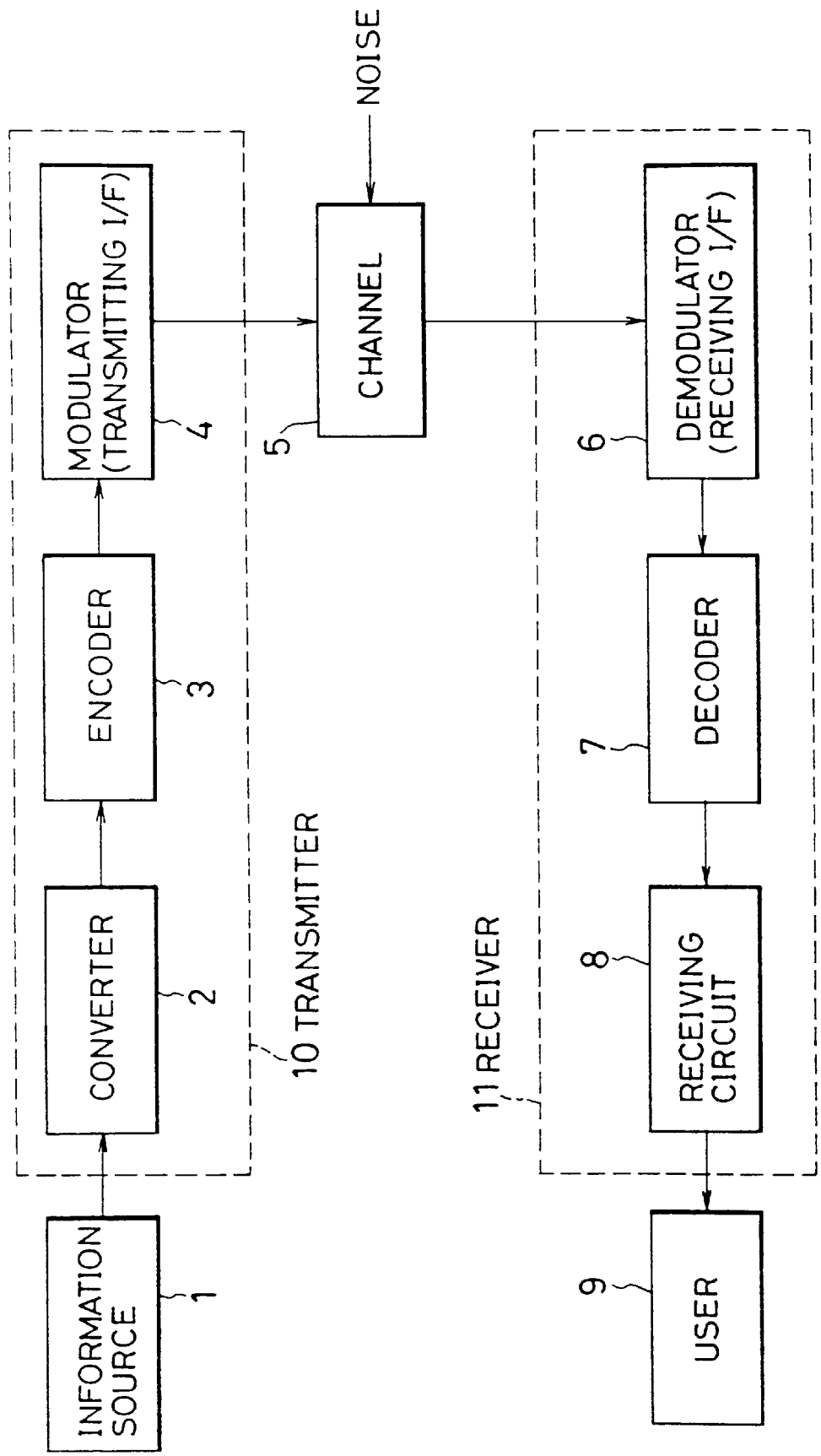
FIG. 1 shows a transmitting system using an error-correcting encoder and an error-correcting decoder according to the invention.

FIG. 1 shows an example of a system configuration using an error-correcting encoder and an error-correcting decoder according to the present invention. FIG. 1 shows a communication system as a whole. 10 denotes a transmitter and 1 denotes an information source for transmission. A converter 2 receives the information from the information source 1 and converts it to an electric signal. An encoder 3 encodes the input signals. 4 denotes a modulator (a transmitting interface). Through the transmitter 10, the information is modulated and transmitted to a channel 5. Whether the information is wired or not, it is disturbed by noise in the channel 5. The disturbed signal of the information is received at a receiver 11. The received information is demodulated to an original form wave by a demodulator 6 (a receiving interface) of the receiver 11 and decoded by a decoder 7. The decoded information is converted to a desired receiving signal and received by a user 9.

Figure 2:
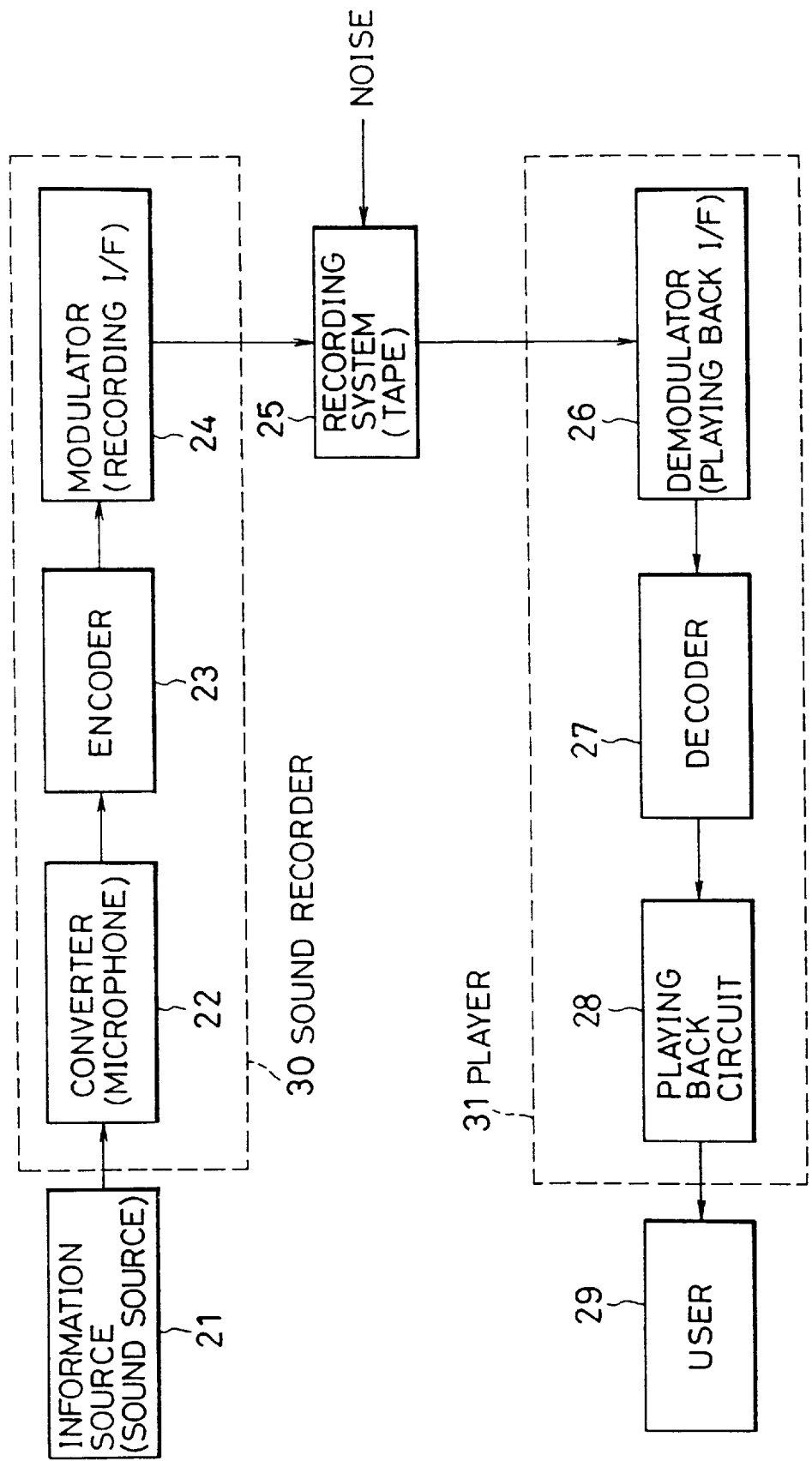
FIG. 2 shows a recording system using an error-correcting encoder and an error-correcting decoder according to the invention.

FIG. 2 is another example of a system configuration for recording and playing back of a sound recorder, and the like. In FIG. 2. 21 denotes an information source (sound source). A sound recorder 30 receives the information and then it is converted to an electric signal by a converter 22 (a microphone). The received signal is encoded by an encoder 23, modulated by a modulator 24 (a recording interface), and recorded by a recording system 25, e.g., a tape recorder. The signal is disturbed by noise when it is recorded or played back in the recording system 25. In a player 31, the signal is received from the tape, the recorded signal is demodulated by a demodulator 26 and decoded to an original electric signal form by a decoder 27. The decoded signal is received by a user 29 as sound through a play back circuit 28, e.g., a speaker.

An error-correcting encoder and an error-correcting decoder of the present invention can be applied to the encoder 2, 23 and the decoder 7, 27 in the systems shown in FIGS. 1 and 2.

The error-correcting encoder and the error-correcting decoder can be configured as special-purpose hardware and also configured as software executed by a general-purpose processor. In either way, the information is encoded by the transmitter and decoded by the receiver to avoid disturbance, which may be obtained through the channel or the recording system. The invention reduces the processing time for encoding and decoding. Some concrete applications will follow as embodiments of the invention.

According to a first embodiment of the invention, an error-correcting encoder for a plurality of parallel inputs will be explained below referring to FIG. 3.

The coding method is now explained. For example, the information is encoded using a double-error-correcting RS code having the code length n=255, the number of the information symbols k=251 and the minimum distance d=5, on the GF ($2^8$). In the RS code, 8 bits make one symbol. A generating polynomial $$G(x) = x^4 + g_3 x^3 + g_2 x^2 + g_1 x + g_0$$

is supposed to have roots 1, $\alpha$, $\alpha^2$, $\alpha^3$ ($\alpha$ is a root of a primitive polynomial). In this embodiment, two information symbols are input simultaneously to the encoder and the two symbols are encoded in parallel. The application of the embodiment is not limited to the parallel encoding of two input information symbols. More than two input information symbols can be encoded in parallel.

Figure 3:
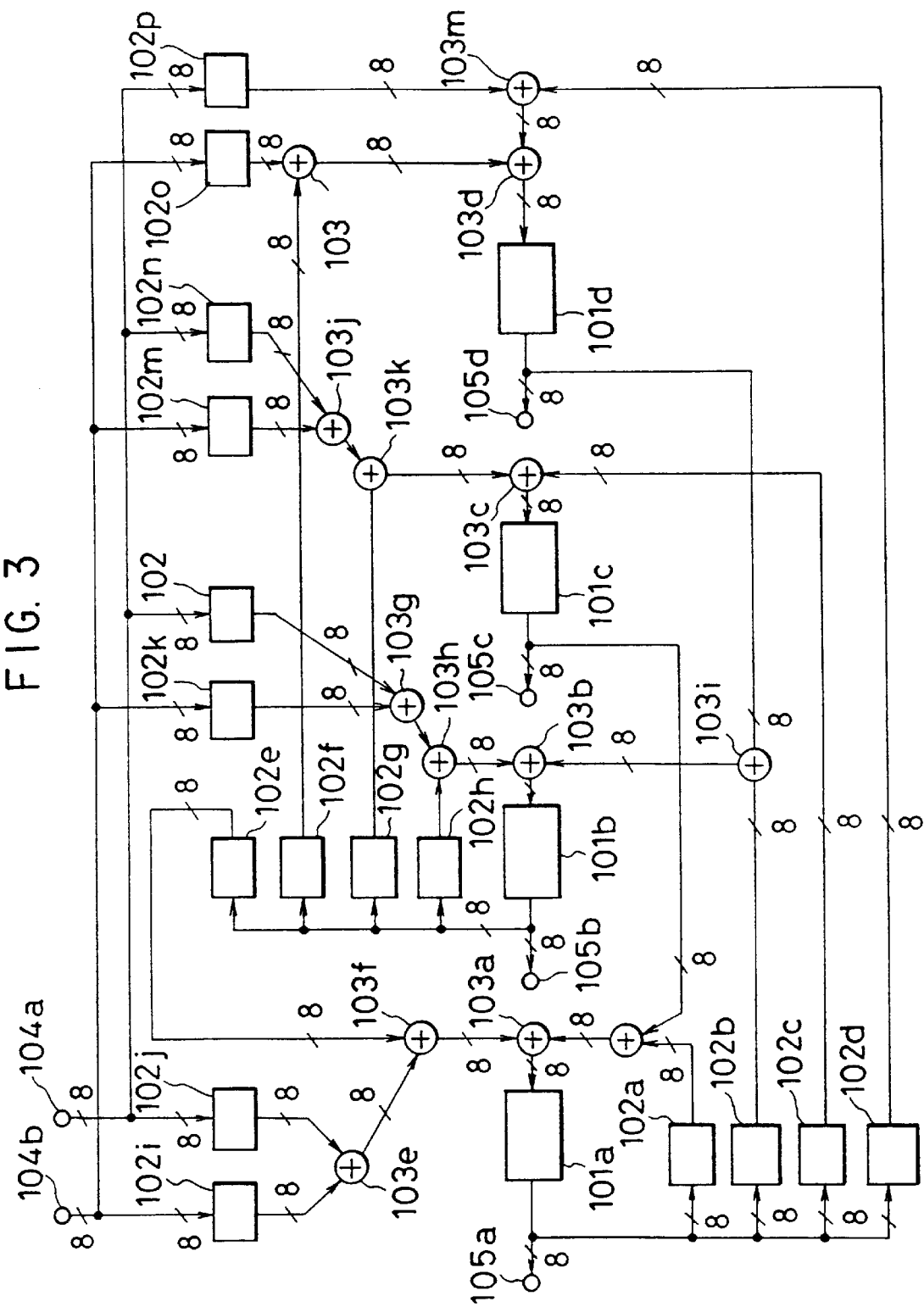
FIG. 3 is a block diagram showing the configuration of an error-correcting encoder according to one embodiment of the invention.

FIG. 3 is a block diagram showing the error-correcting encoder of the embodiment. In the figure, $101_a$–$101_d$ denote 8-bit shift registers. Galois field multipliers $102_a$–$102_p$ perform the following multiplications:

$102_a$ ... $\times(g_3^2+g_2)$
$102_b$ ... $\times(g_3 g_2+g_1)$
$102_c$ ... $\times(g_3 g_1+g_0)$
$102_d$ ... $\times(g_3 g_0)$
$102_e$ ... $\times g_3$
$102_f$ ... $\times g_0$
$102_g$ ... $\times g_1$
$102_h$ ... $\times g_2$
$102_i$ ... $\times(g_3^2+g_2)$
$102_j$ ... $\times g_3$
$102_k$ ... $\times(g_3 g_2+g_1)$
$102_l$ ... $\times g_2$
$102_m$ ... $\times(g_3 g_1+g_0)$
$102_n$ ... $\times g_1$
$102_o$ ... $\times(g_3 g_0)$
$102_p$ ... $\times g_0$ $E_X OR$ gates $103_a$–$103_m$ perform $E_X OR$ operations. $104_a$ and $104_b$ denote input terminals and $105_a$–$105_d$ denote output terminals.

The operation is now explained. Among the received information symbols $m_{250}, \ldots, m_0$, the symbols which have even-numbered subscripts are input to the input terminal $104_a$ sequentially from $m_{250}, m_{248} \ldots$, and the symbols which have odd-numbered subscripts are input to the input terminal $104_b$ sequentially from $m_{249}, m_{247} \ldots$ From the calculation with one shift, this encoder can obtain the result which equals the result calculated by the conventional error-correcting encoder (shown in FIG. 11) with two shifts. In other words, the encoder of the invention is configured so that one shift corresponds to two shifts by the conventional encoder. For example, when "A", "B", "C", "D" are stored in the registers $101_a$, $101_b$, $101_c$, $101_d$, the information symbol $m_i$ is input to the input terminal $104_a$ and the information symbol $m_j$ is input to the input terminal $104_b$. The contents of the registers become as follows after one shift:

$101_a$ ... $(g_3^2+g_2)$ A+$g_3$ B+C+$(g_3^2+g_2)$ $m_j$+$g_3$ $m_i$
$101_b$ ... $(g_3 g_2+g_1)$ A+$g_2$ B+D+$(g_3 g_2+g_1)$ $m_j$+$g_2$ $m_i$
$101_c$ ... $(g_3 g_1+g_0)$ A+$g_1$ B+$(g_3 g_1+g_0)$ $m_j$+$g_1$ $m_i$
$101_d$ ... $(g_3 g_0)$ A+$g_0$ B+$(g_3 g_0)$ $m_j$+$g_0$ $m_i$

Namely, the block diagram is configured so as to produce above results by one shift.

The following is the procedure of encoding. First, the information symbol $m_{250}$ is input to the input terminal $104_a$ and all zeros are input to the input terminal $104_b$. The initial values of the registers $101_a$–$101_d$ are set to all zeros. The information symbols are once shifted, are multiplied by the Galois Field constant and are $E_X ORed$. The results of the operations are stored in the registers $101_a$–$101_d$. Then, the information symbol $m_{248}$ is input to the input terminal $104_a$, the information symbol $m_{249}$ is input to the input terminal $104_b$ simultaneously and the calculation is performed the same as described above. The same operations are repeated to inputting the information symbol $m_1$ and the information symbol $m_0$. After all operations are finished, the outputs of the output terminals $105_a$, $105_b$, $105_c$, $105_d$ become the check symbols $r_3$, $r_2$, $r_1$, $r_0$ respectively.

The aspect of the operating speed and the circuit scale of the encoder will be discussed. The longest path in this encoder is through one Galois field multiplier and three $E_X OR$ gates, which is longer than the conventional encoder by one $E_X OR$ gate. The encoder of the invention, however, encodes 2 symbols in parallel, so that a nearly two times improved high-speed operation can be done.

Two times as many Galois field multipliers as the conventional encoder are needed for the encoder of the invention. On the other hand, the number of the registers is the same. The circuit scale of the encoder of the invention, as a whole apparatus, can be within two times.

In this embodiment, a double-error-correcting RS code, of which the code length n=255, the number of the information symbols k=251 and the minimum distance d=5, on the GF ($2^8$), is used for encoding. The information can be encoded using shortened codes, of which the code length n is shorter than 255 and n is odd number, in the same way as described above.

In this embodiment, encoding is done using an error-correcting RS code, of which the code length n=255, the number of the information symbols k=251 and the minimum distance d=5, on the GF ($2^8$). As another example, shortened codes, of which the code length n is shorter than 255 and n is even number, can be used for encoding. In this case, among the received information symbols, symbols which have even-numbered subscripts are input to the input terminal $104_b$ and symbols which have odd-numbered subscripts are input to the input terminal $104_a$. All zeros are not input to the input terminal $104_b$ at the first stage.

Another encoding circuit can be easily configured using codes with a different minimum distance and a different number of check symbols, though the number of shift register stages becomes different because of a different generating polynomial.

In this embodiment, the error-correcting encoder uses an error-correcting RS code, of which the code length n=255, the number of the information symbols k=251 and the minimum distance d=5, on the GF ($2^8$). Another error-correcting encoder can be configured in the same way using another cyclic code, e. g., BCH code with a different number of bits.

In the above embodiment, two information symbols are encoded in parallel. When n information symbols are encoded in parallel, the encoder is configured so as to produce the result which equals the result obtained by the conventional encoder with n times the number of shifts. The following is an example in which four information symbols are encoded in parallel. In case that information symbols $m_i$, $m_j$, $m_k$, $m_l$ (the number of degrees of each term of the coding polynomial is set as $m_i > m_n > m_k > m_l$) are encoded simultaneously, the contents of each register becomes as follows after one shift:

101a...$(g_3^4 + 3g_3^2 g_2 + 2g_3 g_1 + g_2^2 + g_0)A +$
$(g_3^3 + g_3^2 g_2 + g_3 g_2 + g_1)B + (g_3^2 + g_2)C + g_3 D +$
$(g_3^4 + 3g_3^2 g_2 + 2g_3 g_1 + g_2^2 + g_0)m_i +$
$(g_3^3 + g_3^2 g_2 + g_3 g_2 + g_1)m_j + (g_3^2 + g_2)m_k + g_3 m_l$

101b...$(g_3^3 g_2 + g_3^2 g_1 + 2g_3 g_2^2 + g_3 g_0 + 2g_2 g_1)A +$
$(g_3^2 g_2 + g_3 g_1 + g_2^2 + g_0)B + (g_3 g_2 + g_1)C + g_2 D +$
$(g_3^3 g_2 + g_3^2 g_1 + 2g_3 g_2^2 + g_3 g_0 + 2g_2 g_1)m_i +$
$(g_3^2 g_2 + g_3 g_1 + g_2^2 + g_0)m_j + (g_3 g_2 + g_1)m_k + g_2 m_l$

101c...$(g_3^3 g_1 + g_3^2 g_0 + 2g_3 g_2 g_1 + g_2 g_0 + g_1^2)A +$
$(g_3^2 g_1 + g_3 g_0 + g_2 g_1)B + (g_3 g_1 + g_0)C + g_1 D +$
$(g_3^3 g_1 + g_3^2 g_0 + 2g_3 g_2 g_1 + g_2 g_0 + g_1^2)m_i +$
$(g_3 g_1 + g_0)m_k + g_1 m_l$

101d...$(g_3^3 g_0 + 2g_3 g_2 g_0 + g_1 g_0)A + (g_3^2 g_0 + g_2 g_0)B +$
$(g_3 g_0)C + g_0 D + (g_3^3 g_0 + 2g_3 g_2 g_0 + g_1 g_0)m_i +$
$(g_3^2 g_0 + g_2 g_0)m_j + (g_3 g_0)m_k + g_0 m_l$

Embodiment 2

The following is another example of an error-correcting encoder with parallel inputs.

Figure 4:
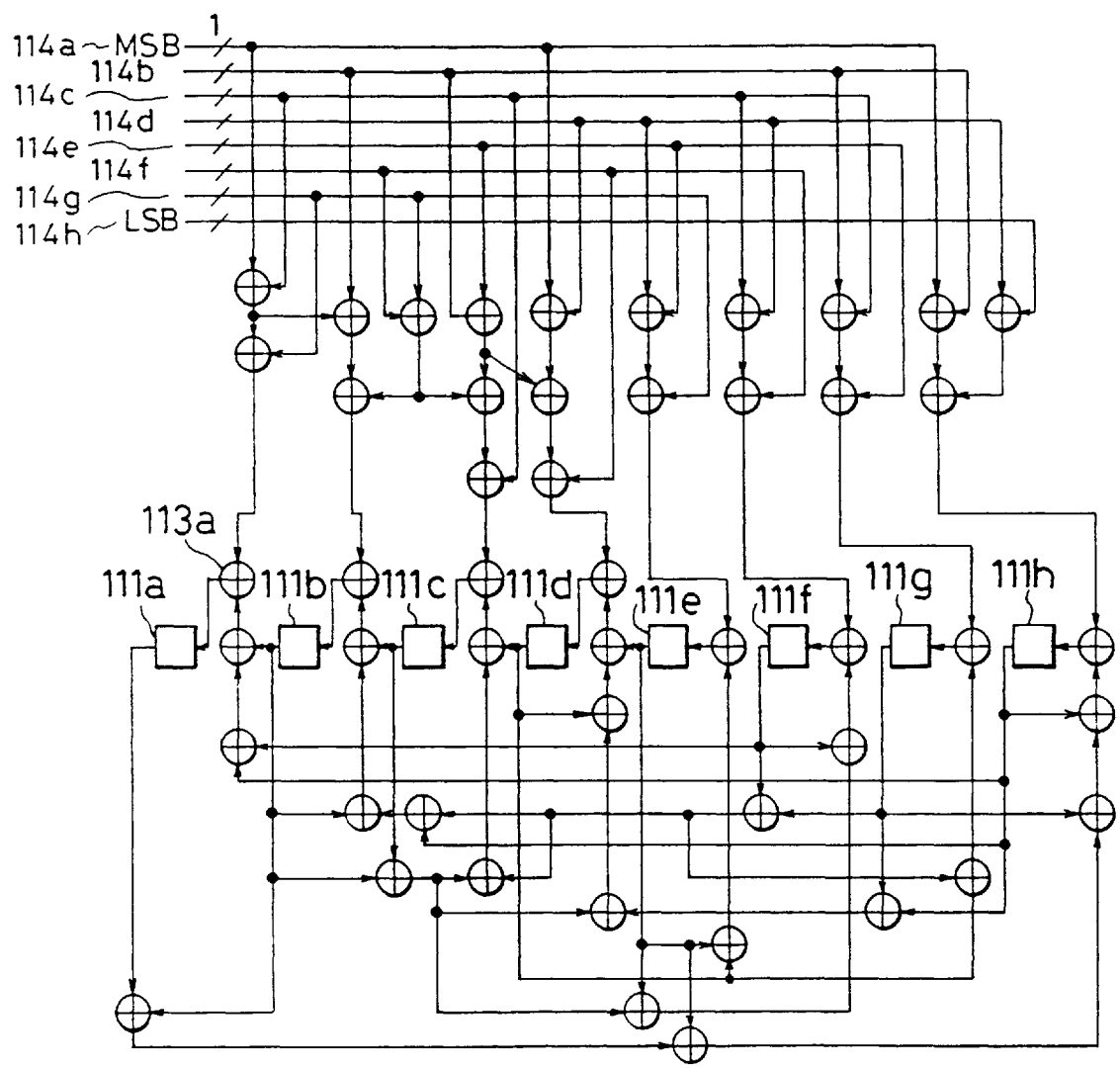
FIG. 4 is a block diagram showing the configuration of an error-correcting encoder according to a second embodiment of the invention.

FIG. 4 shows an example of an 8-bit parallel encoding circuit for a 2-bit error-correcting BCH code, of which the code length n=15, the information length k=7 and the generating polynomial G (X)=$X^8 + X^7 + X^6 + X + 1$. In the figure, 111a–111h denote 1-bit shift registers, 113a denotes an $E_X$OR gate for performing a 1-bit $E_X$OR operation, and 114a–114h are input terminals. A check bit of the output is obtained from the outputs of the shift register stages 111a–111h.

This encoding circuit finishes encoding with twice the number of inputs to calculate a check bit with 8 bits because the code length of the BCH code is 15 bits at a maximum. "0" is set to the LSB for the first input.

The encoding circuit of this embodiment can then calculate the check bit with only two inputs, though the circuit scale is increased, while the conventional encoding circuit needs input 15 times.

Embodiment 3

An error-correcting decoder according to another embodiment of the invention, in which syndromes are generated using a plurality of received symbols input in parallel, will be explained referring to FIG. 5.

In this embodiment, a syndrome generator of the decoder receives the information symbols encoded by encoding system of Embodiment 1. Also in this embodiment, two information symbols are input to the decoder and decoded in parallel. More than two information symbols can be decoded in parallel by the error-correcting decoder of another embodiment.

Figure 5:
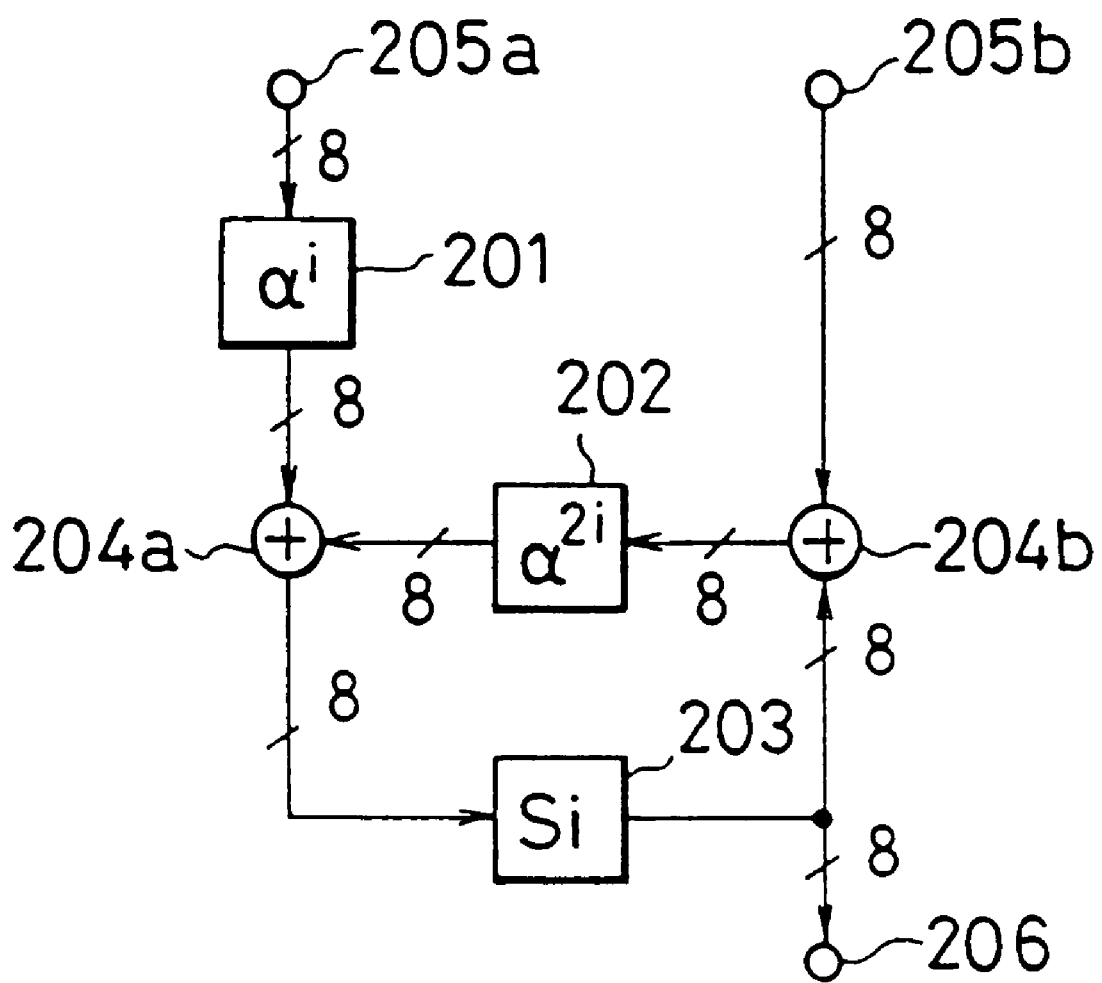
FIG. 5 is a block diagram showing the configuration of a syndrome generating circuit of an error-correcting decoder according to a third embodiment of the invention.

FIG. 5 shows a block diagram showing the syndrome generator of the error-correcting decoder according to this embodiment. In the figure, Galois field multipliers 201 and 202 perform the following multiplications:

201 ... $\times \alpha^i$

202 ... $\times \alpha^{2i}$ 203 denotes an 8-bit shift register stage. $E_X$OR gates $204_a$, $204_b$ perform $E_X$OR operations bit by bit. $205_a$ and $205_b$ denote input terminals and 206 denotes an output terminal.

The operation of the syndrome generator will be explained below. In the received word composed of 255 symbols, $y = (y_{254}, \ldots, y_1, y_0)$ symbols which have even-numbered subscripts are input to the input terminal $205_a$, while symbols which have odd-numbered subscripts are input to the input terminal $205_b$.

Figure 12:
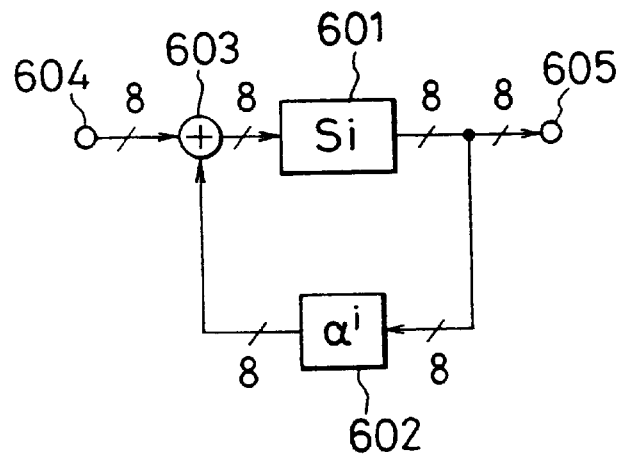
FIG. 12 is a block diagram showing the configuration of a conventional syndrome generating circuit.
Figure 13:
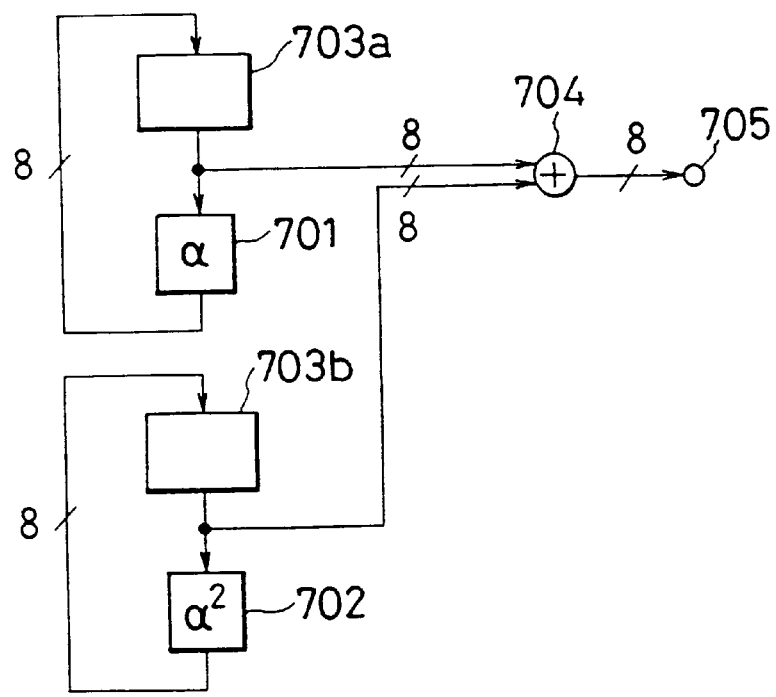
FIG. 13 is a block diagram showing the configuration of a conventional Chien-Search circuit.

With only one shift, the syndrome generator of the invention can obtain the result which equals the result obtained by the conventional syndrome generator (shown in FIG. 12) with two shifts.

The syndrome $S_i$ is calculated as follows: The initial values of the registers 203 are all set to zeros, $y_{254}$ is input to the input terminal $205_a$, and zero is input to the input terminal $205_b$. The result obtained from one shift is stored in the register 203. Then $y_{252}$ is input to the input terminal $205_a$, $y_{253}$ is input to the input terminal $205_b$. The result obtained from one shift is stored in the register 203 in the same way as described above. The same operation is repeated by inputting $y_1$ and $y_0$. After all operations are finished, the syndrome $S_i$ is output from the output terminal 206.

Generally, the number of syndrome generators is equal to the number of check symbols.

The aspect of the operation speed and the circuit scale of the syndrome generator will be discussed below. The longest path of the syndrome generator is through one Galois field multiplier and two $E_X$OR gates, which is longer by one $E_X$OR gate than the conventional syndrome generator. The syndrome generator of the invention, however, can generate syndromes at nearly twice the speed as the conventional syndrome generator by processing two symbols simultaneously in parallel.

As for the circuit scale, the syndrome generator of the invention needs twice as many Galois field multipliers as the conventional generator and the number of the shift register stages is the same as the conventional generator. As a whole apparatus, the circuit scale of the syndrome generator is less than twice as large as the conventional generator.

In this embodiment, the shortened code having a code length n=255 is used. The syndrome $S_i$ can be calculated from the shortened code, of which the code length n is less than 255 and also an odd number, in the same way. The greater the reduction in the number of the check symbols, the greater the reduction in the number of the syndrome generators.

For another example, the shortened code, of which the code length is less than 255 and also an even number, is used. The information symbols which have even-numbered subscripts are input to the input terminal $205_b$, and the information symbols which have odd-numbered subscripts are input to the input terminal $205_a$. In this case, all zeros are not input to the input terminal $205_a$ at the first stage.

In this embodiment, code symbols are decoded using an error-correcting RS code, of which the code length n=255, the number of the information symbols k=251 and the minimum distance d=5, on the GF ($2^8$). Another error-correcting decoder, in which the syndrome generator generates syndrome using another kind of cyclic code, e.g., BCH code with different number of bits, can be configured in the same way. The greater the reduction in the number of check symbols, the greater the reduction in the number of syndrome generators.

Two received symbols are processed in parallel in this embodiment. In the case of n information symbols being processed in parallel, a syndrome generator is configured so as to produce the result which equals the result produced by the syndrome generator of the conventional decoder with n shifts. The following describes processing of four symbols in parallel, for example. The syndromes are generated from four received symbols $y_i$, $y_j$, $y_k$, $y_l$ (the number of degree is $y_i < y_j < y_k < y_l$ in the received polynomials) in parallel. When the contents of the register is "A", the decoder is configured so that the contents of the register should become $$A \ \alpha^{4i} + y_i \ \alpha^{4i} + y_j \ \alpha^{3i} + y_k \ \alpha^{2i} + y_1 \ \alpha^i$$

with one shift.

Embodiment 4

As another example of the error-correcting decoder, the decoder includes a syndrome generator which generates a syndrome from a plurality of symbols input in parallel.

Figure 6:
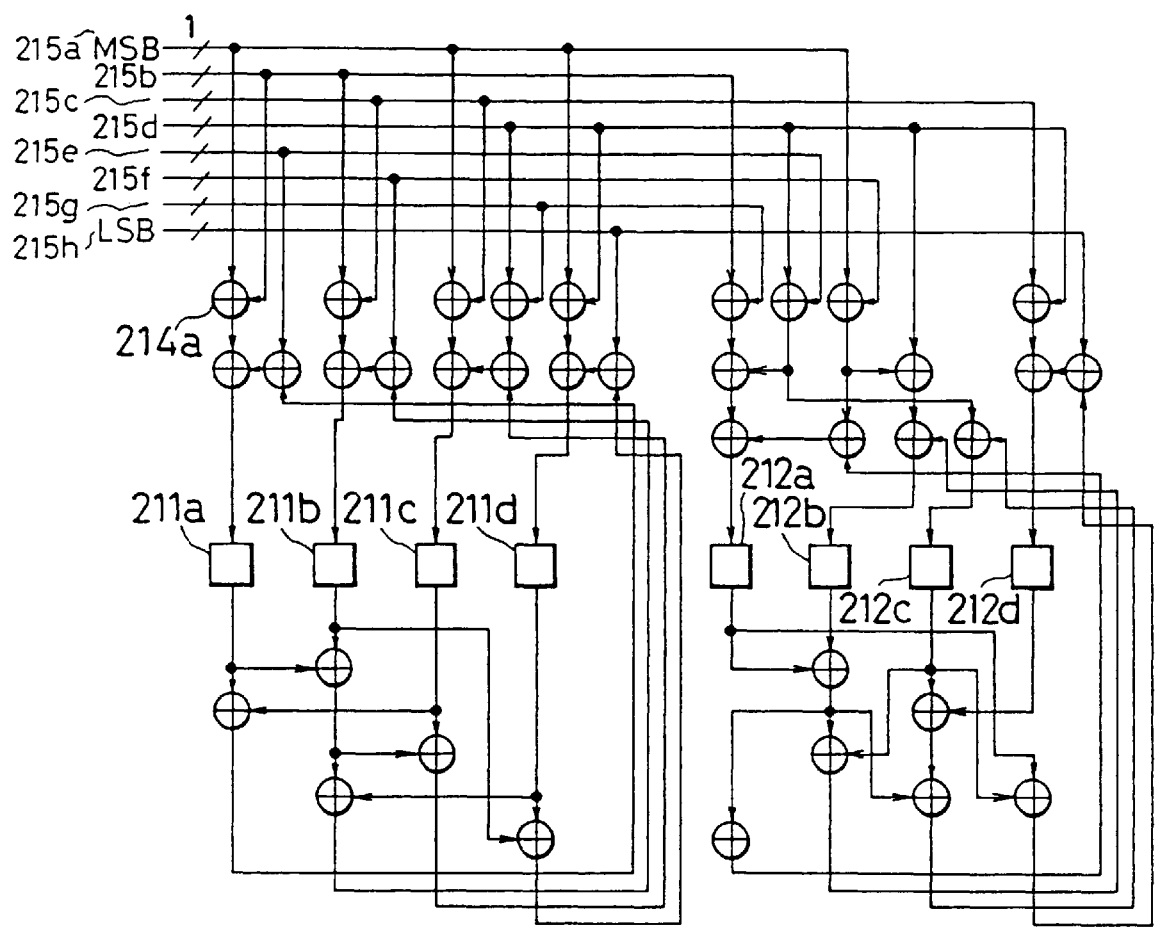
FIG. 6 is a block diagram showing the configuration of a syndrome generating circuit of an error-correcting decoder according to a fourth embodiment of the invention.

FIG. 6 shows a syndrome generator for parallel input with 8 bits, which corresponds to the BCH coding circuit of Embodiment 2 shown in FIG. 4. In this case, the code length and the generating polynomial are the same as Embodiment 2. In FIG. 6, $211_a$–$211_d$ and $212_a$–$212_d$ denote 1-bit shift register stages. $214_a$ denotes an $E_X$OR gate and $215_a$–$215_h$ are input terminals.

In this circuit, syndrome $S_1$ of 4 bits is calculated by the four shift-registers $211_a$–$211_d$ and syndrome $S_3$ of 4 bits is calculated by the four shift-registers $212_a$–$212_d$ from parallel input with 8 bits.

Embodiment 5

Another embodiment, in which an error-correcting decoder executes a Chien-Search for obtaining a plurality of roots of the error location polynomial in parallel, will be explained referring to FIG. 7.

In this embodiment, double errors are supposed to occur in the word, which is encoded by the encoder of Embodiment 1, received in the Chien-Search circuit. The coefficients $\sigma_1$, $\sigma_0$ of the error-location polynomial $$\sigma \ (z) = z^2 + \sigma_1 \ z + \sigma_0$$

are calculated previously from the syndromes.

Two symbols $\alpha^i$ and $\alpha^{i+1}$ (i=0, 2, 4, . . . , 252) are checked simultaneously as roots of $\sigma$ (z) in this embodiment. More than two symbols can be checked simultaneously.

Figure 7:
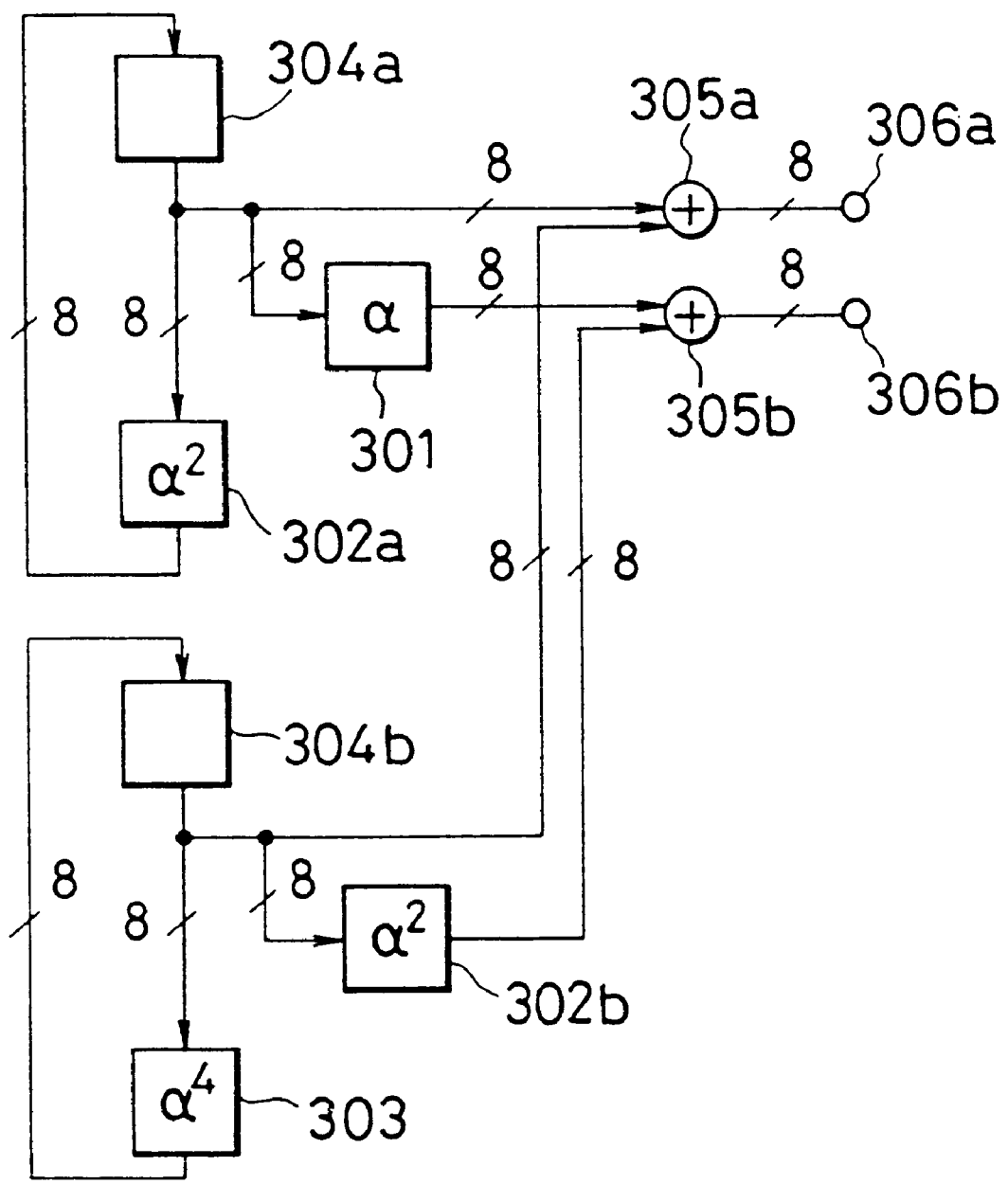
FIG. 7 is a block diagram showing the configuration of a Chien-Search circuit of an error-correcting decoder according to a fifth embodiment of the invention.

FIG. 7 shows a block diagram of the Chien-Search circuit of the error-correcting decoder. Galois field multipliers 301, $302_a$, $302_b$ and 303 perform the following multiplications respectively:

| 301 | ... | $\times \alpha$ |
|---|---|---|
| $302_a, 302_b$ | ... | $\times \alpha^2$ |
| 303 | ... | $\times \alpha^4$ |

$304_a$ and $304_b$ are 8-bit shift register stages, $305_a$ and $305_b$ are $E_X$OR gates for performing $E_X$OR operations, and $306_a$ and $306_b$ are output terminals.

The operation of the error-correcting decoder of the embodiment will be explained below. The initial values $\sigma_1$ and "1" are input to the registers $304_a$ and $304_b$, respectively. The outputs from the output terminals $306_a$ and $306_b$ are checked if they are $\sigma_0$ or not. When the output of the output terminal $306_a$ is $\sigma_0$, $\alpha^0$ is the root of $\sigma$ (z), which means an error occurs in the received symbol $y_0$. When the output terminal $306_b$ outputs $\sigma_0$, $\alpha^1$ is the root of $\sigma$ (z), which means an error occurs in the received symbol $y_1$.

The data is shifted once, the outputs from the output terminals $306_a$ and $306_b$ are checked if they are $\sigma_0$ or not. When the output of the output terminal $306_a$ is $\sigma_0$, $\alpha^2$ is the root of $\sigma$ (z), which means an error occurs in the received symbol $y_2$. When the output terminal $306_b$ outputs $\sigma_0$, $\alpha^3$ is the root of $\sigma$ (z), which means an error occurs in the received symbol $y_3$.

The above steps are repeated to $\alpha^{254}$ and two roots of the polynomial $\sigma$ (z) are obtained.

The following describes the operation speed and the circuit scale of the decoder. The longest path of the decoder is through one Galois field multiplier, which is almost the same as the conventional Chien-Search circuit. Accordingly, the decoder of the embodiment can process at almost twice the speed as the conventional decoder by processing two symbols in parallel.

As for an aspect of the circuit scale, the decoder of the embodiment needs twice as many Galois field multipliers as the conventional decoder and the number of the shift-registers is the same as the conventional decoder. As a whole circuit, the circuit scale becomes not more than twice.

The case of double errors has been explained above. The error-correcting decoder for a single error can be also easily configured according to the embodiment.

In this embodiment, code symbols are decoded using an error-correcting RS code, of which the code length n=255, the number of the information symbols k=251 and the minimum distance d=5, on the GF ($2^8$). An error-correcting decoder, which generates a syndrome from another kind of code, can be configured easily.

Two received symbols are processed in parallel to obtain the roots of the error-location polynomial in this embodiment. On processing n information symbols in parallel, the Galois field multiplier is desired to be configured to obtain the result which equals the result obtained by the Chien-Search circuit of the conventional decoder with n shifts.

Embodiment 6

In Embodiment 5, the error-correcting decoder has the Chien-Search circuit which searches two symbols simultaneously, that is, searches an error-location in about half the processing time for the code having 8 bits as one symbol.

In this embodiment, another Chien-Search circuit will be described, which searches 8 symbols simultaneously for the code having the code length n=15 and 4 bits as one symbol. FIG. 8 shows the Chien-Search circuit according to Embodiment 6. In the figure, $314_a$ and $314_b$ are the registers for setting the initial values. $315_a$–$315_h$ are $E_X$OR gates for performing $E_X$OR operations with 4 bits, and $316_a$–$316_h$ are parallel output terminals. 321, $322_a$, $322_b$, 323, $324_a$, $324_b$, 325, $326_a$, $326_b$, 327, $328_a$, $328_b$, 329, 330, 331, and 332 are 4-bit Galois Field multipliers.

The operation of this Chien-Search circuit is the same as that of Embodiment 5. Namely, a and "1" are input to the registers $314_a$ and $314_b$ respectively, and it is checked whether each of the outputs from the output terminals $316_a$–$316_h$ is $\sigma_0$ or not. The locations of 8 symbols can be evaluated simultaneously by the circuit configured as shown in FIG. 8, so that the error-location can be searched in one eighth the time as the conventional Chien-Search circuit.

Embodiment 7

Another embodiment, in which an error-correcting decoder converts the syndromes by multiplying the elements on the GF previously corresponding to the shortened length of the shortened code, will be explained below.

In this embodiment, the shortened RS code for correcting double errors, of which the code length n=36, the number of information symbols k=32 and the minimum distance d=5, is used. In this case, the decoder receives the code, of which information symbols are assigned to the coefficients of the terms from 35 degrees to 4 degrees of the code polynomial w (x). The check symbols are assigned to the coefficients of the terms from 3 degrees to 0 degrees of w (x). The coefficients of the other terms are all zeros. The received word is supposed to have double errors.

Figure 9:
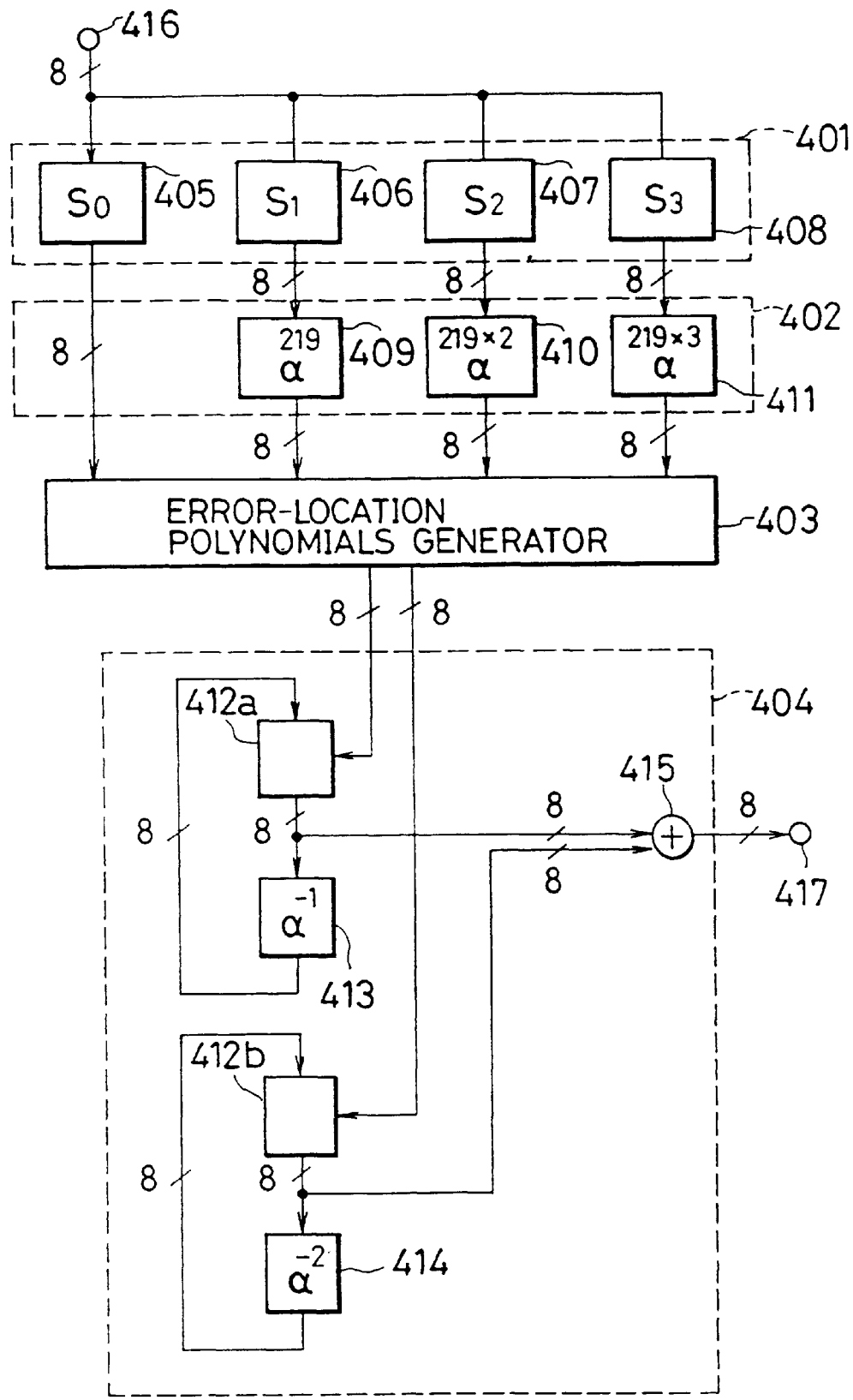
FIG. 9 is a block diagram showing the configuration of an error-correcting decoder according to a seventh embodiment of the invention.

FIG. 9 shows a block diagram of the error-correcting decoder of the embodiment. As shown in FIG. 9, a syndrome generating circuit 401 includes four syndrome generators, which is the same as the syndrome generator shown in FIG. 12. The syndrome generator 405 generates syndrome $S_0$, the syndrome generator 406 generates syndrome $S_1$, the syndrome generator 407 generates syndrome $S_2$ and the syndrome generator 408 generates syndrome $S_3$.

This embodiment is characterized by the Galois field multiplying circuit 402 and in which the Galois field multipliers perform the following multiplications respectively.

Figure 14:
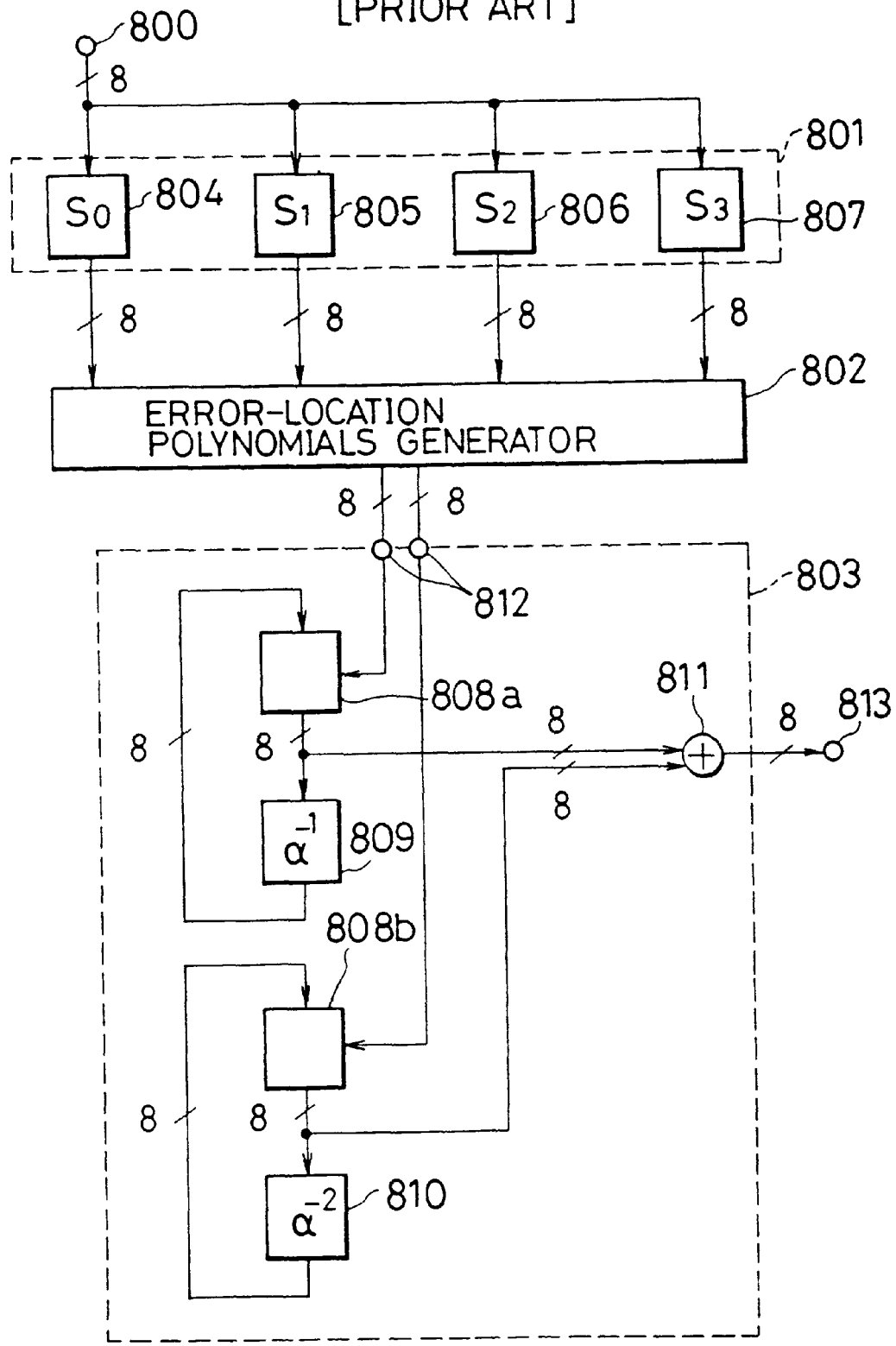
FIG. 14 is a block diagram showing the configuration of a conventional error-correcting decoder.

409 $\times \alpha^{219}$
410 $\times \alpha^{219*2}$
411 $\times \alpha^{219*3}$ An error-location polynomials generator 403 generates coefficients $\sigma_0$, $\sigma_1$ of the above-mentioned error-location polynomials. A Chien-Search circuit 404 is configured the same as the conventional Chien-Search circuit 803 shown in FIG. 14. 416 denotes an input terminal, and 417 denotes an output terminal.

The operation is now explained. The coefficients $y_{35}$ . . . $y_0$ of the received symbols are input to the input terminal 416 sequentially from the term of 35 degrees of the received polynomial. Then, the coefficients are input to the syndrome generating circuit 401 to calculate four syndromes $S_0$, $S_1$, $S_2$, $S_3$.

The four syndromes are input to the Galois field multiplying circuit 402 to be multiplied according to the following:

syndrome $S_1 \times \alpha^{219}$
syndrome $S_2 \times \alpha^{219*2}$
syndrome $S_3 \times \alpha^{219*3}$ Nothing is multiplied by the syndrome $S_0$ at this time. The calculation results in generating a new syndrome, in which the information symbols are assigned to the coefficients of the terms of higher degrees of the code polynomial w (x), that is, from the terms of 254 degrees to 223 degrees. The check symbols are assigned to the coefficients of the terms from 222 degrees to 219 degrees of w (x), and the coefficients of the other terms are all zeros. Namely, the coefficients from the terms of lower degrees are shifted to the coefficients from the terms of the highest degree. In this way, Chien-Search can be performed from the coefficients of the term of 35 degrees.

From the new syndromes, the coefficients $\sigma_1$, $\sigma_0$ of the error-location polynomial $$\sigma(z) = z^2 + \sigma_1 z + \sigma_0$$

are calculated in an error-location polynomial generator 403.

Then, Chien-Search is performed to obtain the root of the error-location polynomial $\sigma(z)$ in the Chien-Search circuit 404. The Chien-Search circuit 404 is configured the same as the conventional Chien-Search circuit 803 shown in FIG. 14. The Galois field multipliers 413 and 414 perform the following multiplications:

413 . . . $\times \alpha^{-1}$
414 . . . $\times \alpha^{-2}$

The following is a Chien-Search procedure. $\sigma_1$ and "1" are input to the registers $412_a$ and $412_b$ respectively as initial values. After one shift, the output of the output terminal 417 is checked whether it is $\sigma_0$ or not. When the output of the output terminal 417 is $\sigma_0$, $\alpha^{254}$ is the root of the error-location polynomial $\sigma(z)$, which means an error occurs in the received symbol $y_{35}$. After one more shift, the output of the output terminal 417 is checked whether it is $\sigma_0$ or not. When the output of the output terminal 417 is $\sigma_0$, $\alpha^{253}$ is the root of the $\sigma(z)$, which means an error occurs in the received symbol $y_{34}$. The same operation is repeated to obtain two roots of the error-location polynomial $\sigma(z)$.

In this embodiment, the code symbols are decoded symbol by symbol. A decoder which decodes a plurality of symbols in parallel can be configured as easily as the error-correcting decoder which generates syndromes or the decoder which performs a Chien-Search.

In this embodiment, the decoder for RS code has been described, of which the code length n=255, the number of information symbols k=251, and the minimum distance d=5. A decoder using another cyclic code can be also easily configured.

Embodiment 8

In the above embodiments, each circuit of the error-correcting decoder processes a plurality of inputs independently and a plurality of roots is obtained in parallel independently in each circuit.

It can be considered to combine some of these embodiments. For example, combining Embodiment 3 and Embodiment 5, an error-correcting decoder can be configured, which inputs a plurality of received symbols, generates syndromes and obtains a plurality of roots simultaneously from the syndromes by the Chien-Search. That is, the decoder configured as shown in FIG. 9 includes the syndrome generators 405–408 in the syndrome generating circuit 401 as shown in FIG. 5, and the Chien-Search circuit 404 configured as shown in FIG. 7.

Embodiment 9

In the above embodiments, the encoder and the decoder process parallel outputs and inputs of a plurality of codes independently. Furthermore, a data transmitting system with high efficiency of processing time can be configured combining the encoder and decoder. Namely, the error-correcting encoder of Embodiment 1 and the error-correcting decoder of Embodiment 3 are combined as a data transmitting system with error-correcting codes.

Embodiment 10

In Embodiment 7, the error-correcting decoder includes the special-purpose multipliers for multiplying the element on the GF. Even the conventional error-correcting decoder without the special-purpose multipliers can reduce the calculating time as well in the following way. FIG. 10(b) is a flow chart showing calculating procedure according to the invention, while FIG. 10(a) shows the conventional procedure. As shown in FIG. 10(b), the syndrome generated by the syndrome generating circuit, element on the GF of the difference between the code length, which is needless to calculate, and the shortened code length syndrome multiplication is performed at step S1. Namely, when the code length=N and the shortened code length=n, the syndrome $S_i$ is multiplied by the Galois field (GF) constant $\alpha^{(N-n)i}$, for example, the syndrome $S_1$ is multiplied by $\alpha^{N-n}$ and the syndrome $S_3$ is multiplied by $\alpha^{3(N-n)}$. This is a new step for multiplying GF constant.

The operation according to the procedure of the invention will be described referring to FIG. 10(b). For example, 8-bit syndrome is obtained at the start, and the syndrome is multiplied by GF constant for the shortened length at step S1. Four times GF constant multiplications are performed with four syndromes, and the coefficients of the error-location polynomial are calculated at step S2.

From step S3 to S6, the Chien-Search calculating procedure itself according to the invention is the same as the conventional Chien-search calculating procedure o from step S52 to S55. However, the procedure of the invention needs only n calculations (n=the code length of the shortened code) at step 6, while the conventional procedure needs N calculations at step S55.

As has been described, the error-correcting encoder of the invention processes a plurality of symbols in parallel, which enables obtaining the required check symbols with less number of shifts.

Further, according to the invention, the error-correcting decoder including the syndrome generating circuit processes a plurality of symbols in parallel, which enables obtaining the required syndromes with less number of shifts.

Further, according to the invention, the error-correcting decoder including the Chien-Search circuit processes a plurality of symbols in parallel as to obtain the plurality of Chien-Search results simultaneously, which reduces the searching time.

Further, according to the invention, the error-correcting decoder includes the Galois field multipliers for shifting the coefficients to the higher degrees. When a Chien-Search is performed from the term of the highest degree of the code polynomials of the shortened code, the decoder does not need shift calculation for the shortened length of the code, which reduces the time for Chien-Search.

Further, the error-correcting decoder of the invention inputs a plurality of symbols in parallel and performs a plurality of Chien-Searches simultaneously, which reduces decoding time.

Further, according to the invention, the error-correcting encoder which inputs a plurality of symbols in parallel to generate check symbols with less number of shifts, and the error-correcting decoder which inputs a plurality of received symbols to generate syndromes with less number of shifts are provided, so that encoding and decoding time is reduced.

Further, according to the error-correcting decoding method of the invention, generated syndrome is multiplied by a Galois field constant to analyze the error-location, which reduces the processing time even in the general-purpose error-correcting decoding system.

Further, the error-correcting encoder using BCH codes includes the generating polynomials logic circuit for parallel inputs, which reduces calculating time of check bit.

Further, the error-correcting decoder using BCH codes includes the circuit for generating a plurality of syndromes, which reduces calculating time of syndromes.

While the invention has been shown and described with respect to its preferred embodiments, it is to be understood that the words which have been used are words of description rather than limitation and that changes within the purview of the appended claims may be made without departing from the true scope and spirit of the invention in its broader aspects.

What is claimed is:

1. An error-correcting encoder for encoding information symbols, comprising:

(A) a plurality of shift-registers having a plurality of stages equal to a number of check symbols, for generating check symbols by reduced number of shifts; and (B) a plurality of Galois field adders and Galois field multipliers for forming check-symbols-generating-logic so that same check symbols are produced by the reduced number of shifts using plural inputs of the information symbols at the same time and outputs of the shift-registers, and for feeding outputs of the check symbols generating logic to the shift-registers.

2. The error-correcting encoder according to claim 1, wherein two information symbols are input simultaneously.

3. The error-correcting encoder according to claim 1, wherein the information symbols are 1-bit symbols.

4. An error-correcting decoder for decoding code symbols, comprising:

a plurality of syndrome generators including plural Galois field multipliers, and including plural Galois field adders, for generating syndromes of received words using plural received words by a reduced number of shifts;

an error-location polynomials generator for computing coefficients of error-location polynomials by using the syndromes; and a Chien-Search circuit for analyzing error locations by using the syndromes;

wherein two information symbols are input simultaneously.

5. The error-correcting decoder according to claim 4, wherein code symbols include BCH codes.

6. An error-correcting decoder for decoding code symbols, comprising:

a plurality of syndrome generators having inputs connected to simultaneously receive plural code symbols forming received words, and having outputs carrying syndromes of the received words;

an error-location polynomials generator having an input connected to receive the syndromes and an output carrying coefficients of an error-location polynomial; and a Chien-Search circuit composed of plural Galois field multipliers, and composed of plural Galois field adders, which can analyze a plurality of error locations at a time with a reduced number of shifts by using the coefficients of the error location polynomial.

7. The error-correcting decoder according to claim 6, wherein two error locations are output simultaneously.

8. The error-correcting decoder according to claim 6, wherein eight error locations are output simultaneously.

9. An error-correcting decoder for decoding code symbols, comprising:

(A) a plurality of syndrome generators for generating syndromes of a received word;

(B) a plurality of Galois field multipliers for simultaneously multiplying shift-required elements of Galois field by the syndromes when coefficients of high degrees in a code polynomial are zero to generate shifted-syndromes corresponding to a shifted code polynomial having coefficients of lower degrees that are all zero;

(C) an error-location polynomial generator for computing coefficients of an error-location polynomial by using the shifted-syndromes; and (D) a Chien-Search circuit for analyzing error locations by using the coefficients of error-location polynomials.

10. The error-correcting decoder according to claim 9, wherein the Chien-Search circuit analyzes plural error locations simultaneously.

11. The error-correcting decoder according to claim 9, wherein the syndrome generator generates syndromes with a reduced number of shifts by computing each syndrome simultaneously from the plurality of received symbols.

12. An error-correcting decoder for decoding code symbols, comprising:

(A) a plurality of syndrome generators having inputs connected to simultaneously receive plural symbols forming a received word, the syndrome generators further including plural Galois field multipliers and including plural Galois field adders, the plurality of syndrome generators having outputs carrying syndromes of the received word using the plural received symbols in a reduced number of shifts;

(B) error-location polynomial generators having inputs connected to receive the syndromes and outputs carrying coefficients of an error-location polynomial; and (C) a Chien-Search circuit including plural Galois field multipliers, and including plural Galois field adders, for simultaneously analyzing a plurality of error locations at a time with a reduced number of shifts using the error-location polynomial.

13. An error-correcting system for encoding information symbols and decoding code symbols, comprising:

(A) an error-correcting encoder for generating check symbols, and for generating code symbols, wherein the error-correcting encoder has plural shift-registers including stages equal to a number of check symbols, for generating check symbols with a reduced number of shifts, and has plural Galois field adders and plural Galois field multipliers for forming check symbols generating logic so that same check symbols are produced with the reduced number of shifts using plural information symbols at a time and output of the shift-registers; and (C) an error-correcting decoder for decoding code symbols, wherein the error-correcting decoder has plural syndrome generators including plural Galois field multipliers, and including plural Galois field adders, for generating syndromes of received words by using plural received words with a reduced number of shifts, and has a Chien-Search circuit for analyzing error locations by using the coefficients of error-location polynomials.

14. The error-correcting system according to claim 13, wherein two information symbols and two analyzed error locations are given simultaneously.

15. A decoding method for correcting errors of a received word, and for decoding code symbols included in the received word, comprising steps of:

(A) simultaneously receiving a plurality of code symbols forming the received word;

(B) simultaneously multiplying syndromes of the received word by shift-required coefficients of a Galois field to form shifted-syndromes corresponding to a code polynomial having coefficients of all zeros in lower power degrees so that the shifted-syndromes are adjusted for a shortened code;

(C) simultaneously computing coefficients of an error-location polynomial using the shifted syndromes; and (D) simultaneously analyzing error locations within the length of the shortened code using the coefficients of the error-location polynomial.

16. An error-correcting encoder for encoding information symbols, comprising:

a logic circuit including a plurality of adders and multipliers, simultaneously receiving in parallel multiple information symbols and providing outputs in parallel; and a plurality of shift registers, coupled to the logic circuit, receiving the outputs in parallel from the logic circuit and providing a plurality of check symbols therefrom;

wherein the number of shift registers is equal to the number of check symbols.

* * * * *

UNITED STATES PATENT AND TRADEMARK OFFICE
CERTIFICATE OF CORRECTION

PATENT NO. : 5,912,905
DATED : June 15, 1999
INVENTOR(S) : SAKAI et al.

It is certified that error appears in the above-identified patent and that said Letters Patent is hereby corrected as shown below:

On the title page, item:

"[63] Related U.S. Application Data", please change "Continuation of application No. 08/384,950, Feb. 7, 1995, Pat. No. 5,699,368" to -- Continuation-in-part of application No. 08/384,950, Feb. 7, 1995, Pat. No. 5,699,368 --.

Signed and Sealed this

Twenty-second Day of February, 2000

Attest:

Q. TODD DICKINSON

*Attesting Officer*         *Commissioner of Patents and Trademarks*